United States Patent [19]

Otsu et al.

[11] Patent Number: 5,527,481

[45] Date of Patent: Jun. 18, 1996

[54] PIEZOELECTRIC CERAMIC COMPOSITION

[75] Inventors: Satoshi Otsu, Nikaho-machi; Fumikazu Yamane, Honjo; Masaharu Kamihara, Kisakata-machi, all of Japan

[73] Assignee: TDK Corporation, Tokyo, Japan

[21] Appl. No.: 347,811

[22] Filed: Nov. 30, 1994

[30] Foreign Application Priority Data

Dec. 27, 1993 [JP] Japan ..................... 5-311643
Dec. 27, 1993 [JP] Japan ..................... 5-331642

[51] Int. Cl.$^6$ ............................................... C04B 35/48
[52] U.S. Cl. .................... 252/62.9 R; 252/62.9 PZT; 501/135; 501/136
[58] Field of Search ............... 252/62.9, 62.9 PZT; 501/134, 135, 136; C04B 35/49

[56] References Cited

U.S. PATENT DOCUMENTS 5,300,852  4/1994  Isogai et al. ........................... 310/358

FOREIGN PATENT DOCUMENTS

| 0012583 | 6/1980 | European Pat. Off. |
| 3036773 | 2/1991 | Japan. |
| 3049272 | 3/1991 | Japan. |
| 3-201491 | 9/1991 | Japan ..................... 252/62.9 |
| 5-007029 | 1/1993 | Japan. |
| 5-17218 | 1/1993 | Japan ..................... C04B 35/49 |
| 5-17219 | 1/1993 | Japan ..................... C04B 35/49 |
| 5-17220 | 1/1993 | Japan ..................... C04B 35/49 |
| 5-58728 | 3/1993 | Japan ..................... C04B 35/49 |

*Primary Examiner*—Anthony Green
*Attorney, Agent, or Firm*—Hecker & Harriman

[57] ABSTRACT

A piezoelectric ceramic composition by which it is possible to obtain piezoelectric ceramic chip parts having a high electromechanical coupling factor and a high heat-resistance property, and also having a good temperature coefficient of resonance frequency while maintaining the high heat-resistance property and low change over time. The piezoelectric ceramic compositions of the present invention include: (1) a first piezoelectric ceramic composition expressed by the general formula $Pb_y[(Mg_{1/3}Nb_{2/3})_a(Yb_{1/2}Nb_{1/2})_b Ti_c Zr_d]O_3$ (where $a+b+c+d=1$), wherein $0.95 \leq y \leq 1.05$, $0.01 \leq a \leq 0.15$, $0.01 \leq b \leq 0.10$, $0.30 \leq c \leq 0.60$, and $0.25 \leq d \leq 0.55$; (2) a second piezoelectric ceramic composition expressed by the general formula $$(Pb_{1-x}Me_x)[(Mg_{1/3}Nb_{2/3})_a(Yb_{1/2}Nb_{1/2})_b Ti_c Zr_d]O_3$$

(where Me represents at least one element selected from Ba, Sr and Ca, and $a+b+c+d=1$), wherein $0 \leq x \leq 0.12$, $0.01 \leq a \leq 0.15$, $0.01 \leq b \leq 0.10$, $0.30 \leq c \leq 0.60$, and $0.25 \leq d \leq 0.55$; (3) a third piezoelectric ceramic composition in which Yb, treated as trivalent in the first piezoelectric ceramic composition, is treated as bivalent and which is expressed by the general formula $$Pb[(Mg_{1/3}Nb_{2/3})_e(Yb_{1/3}Nb_{2/3})_f Ti_g Zr_h]O_3$$

(where Me represents at least one element selected from Ba, Sr and Ca, and $e+f+g+h=1$), wherein $0 < x \leq 0.12$, $0.01 \leq e \leq 0.15$, $0.01 \leq f \leq 0.15$, $0.30 \leq g \leq 0.60$, and $0.25 \leq h < 0.58$; (4) a fourth piezoelectric ceramic composition that is obtained by adding at least one element selected from Cr and Mn as a secondary component to the third piezoelectric ceramic composition, and (5) a fifth piezoelectric ceramic composition expressed by the general formula $$(Pb_{1-x}Me_x)[(Mg_{1/3}Nb_{2/3})_e(Yb_{1/3}Nb_{2/3})_f Ti_g Zr_h]O_3$$

(where Me represents at least one element selected from Ba, Sr and Ca, and $e+f+g+h=1$), wherein $0 < x \leq 0.12$, $0.01 \leq e \leq 0.15$, $0.01 \leq f \leq 0.15$, $0.30 \leq g \leq 0.60$, and $0.25 \leq h < 0.58$.

4 Claims, 2 Drawing Sheets

PIEZOELECTRIC CERAMIC COMPOSITION

BACKGROUND OF THE INVENTION

1. FIELD OF THE INVENTION

The present invention relates to a piezoelectric ceramic composition, and in particular to a piezoelectric ceramic composition suitable for use in a ceramic oscillator, ceramic discriminator, ceramic filter or surface wave elastic element.

2. BACKGROUND ART

The parts used in conventional electronic equipment and devices are lead-type resin molded products. Soldering is performed by inserting the lead wires of the parts into a printed circuit board and immersing in a molten solder bath the surface with no parts mounted on it. Thus, the mounted parts are not exposed to temperatures of 200° C. or higher.

With the progress made in recent years in the miniaturization of electronic equipment and devices, the use of surface packaging and mounting is increasing. To solder parts in surface packaging, chip parts with no lead wires on them are provisionally mounted on a printed circuit board and the entire printed circuit board is heated in a reflow furnace. As a result, the chip parts mounted on the printed circuit board are exposed during soldering to temperatures in the reflow furnace of around 250° C.

The materials used in conventional type piezoelectric elements include: a piezoelectric ceramic composition in which a piezoelectric property is improved by adding $Cr_2O_3$, $MnO_2$, $Fe_2O_3$, $Bi_2O_3$, etc. to a two-component ceramic composition of $PbTiO_3$—$PbZrO_3$ to make a three-component composition; a piezoelectric ceramic composition in which a piezoelectric property is improved by adding $Pb(Co_{1/3}Nb_{2/3})O_3$, $Pb(Mg_{1/3}Nb_{2/3})O_3$, $Pb(Mn_{1/3}Nb_{2/3})O_3$, $Pb(Ni_{1/3}Nb_{2/3})O_3$, etc. to a two-component ceramic composition of $PbTiO_3$—$PbZrO_3$ to make a three-component composition; or a three-component ceramic composition of $PbTiO_3$—$PbZrO_3$—$Pb(Yb_{1/2}Nb_{1/2})O_3$ as disclosed in Japanese laid-open publication No. 3-36773.

However, conventional piezoelectric elements having lead wires are usually not exposed to temperatures of 200° C. or higher, and the ceramic compositions used in these piezoelectric elements are not designed to be exposed to temperatures of 200° C. or higher.

For this reason, when these conventional piezoelectric elements are mounted on electronic devices and are exposed for soldering to temperatures around 250° C. in the reflow furnace, the mechanical quality factor (Qm) and electromechanical coupling factor (kp) decrease. It is difficult to obtain piezoelectric element chip parts with reliable heat-resistance properties.

Also, polarization occurs in conventional piezoelectric ceramic materials when they are exposed to temperatures of 200° C. even when the material has a Curie point of 300° C. or more. Further, piezoelectric properties, such as electromechanical coupling factor, decrease. In a ceramic oscillator using conventional piezoelectric material, the resonance frequency deviates extensively from the initial frequency over time.

SUMMARY OF THE INVENTION

It is an object of the present invention to provide a piezoelectric ceramic composition that solves the above problems, does not deteriorate even when exposed to temperatures of 200° C. or higher, exhibits less change over time, has a resonance frequency that does not deviate extensively from an initial frequency due to change over time, and causes no problems due to depolarization.

To attain the above object, the present invention limits the range of product composition in each of the following compositions: (1) a first piezoelectric ceramic composition, in which $(Mg_{1/3}Nb_{2/3})O_3$ is solubilized as a third component and $(Yb_{1/2}Nb_{1/2})O_3$ as a fourth component to $PbTiO_3$—$PbZrO_3$; (2) a second piezoelectric ceramic composition, which is obtained by substituting a part of Pb in the first piezoelectric ceramic composition with at least one element selected from Ba, Sr and Ca; (3) a third piezoelectric ceramic composition, in which Yb is treated as bivalent while it is treated as trivalent in the first piezoelectric ceramic composition; (4) a fourth piezoelectric ceramic composition, which is obtained by adding at least one element selected from Cr and Mn to the third piezoelectric ceramic composition as a secondary component; and (5) a fifth piezoelectric ceramic composition obtained by substituting a part of Pb in the third piezoelectric ceramic composition with at least one element selected from Ba, Sr and Ca.

By the use of a piezoelectric ceramic element using the piezoelectric ceramic compositions of (1) to (3) and (5) above, it is possible to obtain a piezoelectric ceramic composition which has a high electromechanical coupling factor and high heat-resistance property, and exhibits a low temperature coefficient of resonance frequency and less change over time. By the use of a piezoelectric ceramic composition of (4) above, it is possible to obtain the mechanical quality factor desired due to the secondary component without decreasing the piezoelectric property, and while still maintaining the heat-resistance property and low change over time.

DETAILED DESCRIPTION OF THE INVENTION

The following is a description of the embodiments of the present invention in connection with the drawings and the tables as attached.

Figure 1:
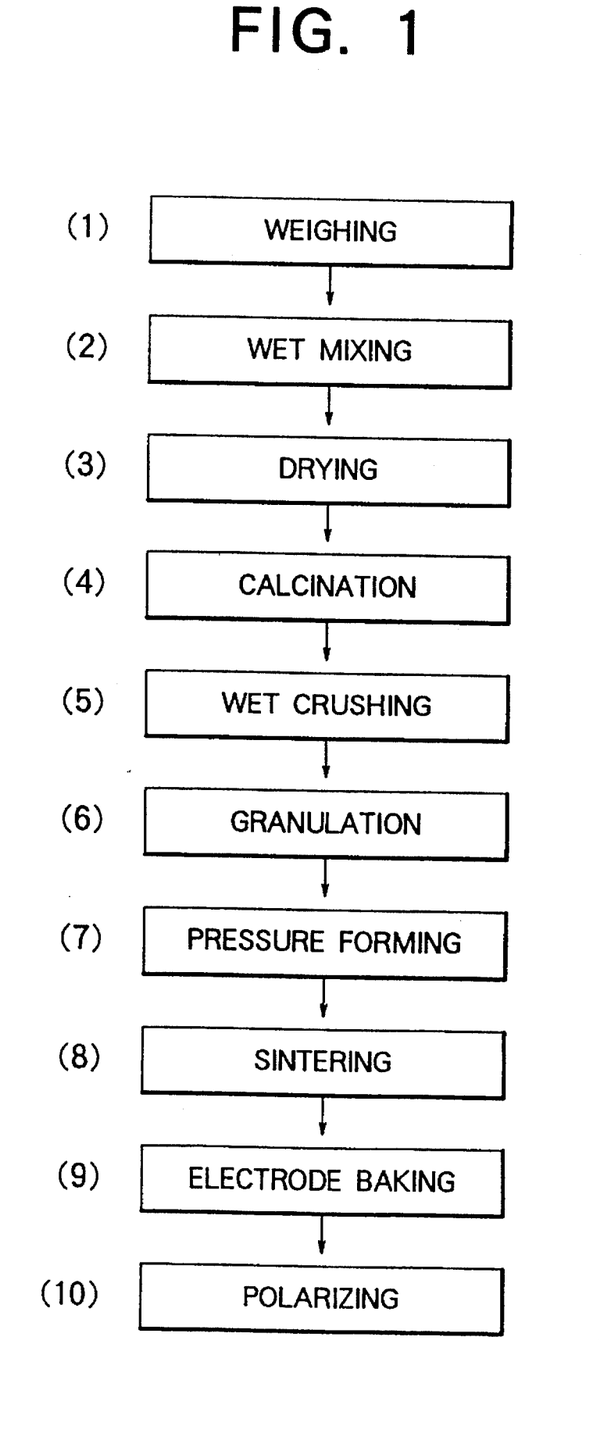
FIG. 1 is a manufacturing process chart illustrating the use a piezoelectric ceramic composition of the present invention for piezoelectric chip parts.

A piezoelectric ceramic disk using the piezoelectric ceramic composition of the present invention is manufactured through the following manufacturing processes, as given in FIG. 1:

(1) Raw materials are weighed.
(2) The weighed materials are processed by wet mixing in a ball mill.
(3) The mixture processed by wet mixing is dried.
(4) The dried material is calcinated at 750° C. to 950° C.
(5) The calcinated material is processed by wet crushing in a ball mill.
(6) To the powder thus obtained, a proper amount of an organic binder is added to granulate it.
(7) The material thus granulated is processed by pressure forming under pressure of 4 tons/cm².

(8) The formed material is sintered at 1130° C. to 1250° C.

(9) On both surfaces of the sintered product, silver electrodes are baked and mounted.

(10) In silicone oil kept at 50° C. to 120° C., a DC electric field of 2 to 3 MV/m is applied for one hour for polarizing.

PbO, $MgCO_3$, $Yb_2O_3$, $Nb_2O_5$, $TiO_2$ and $ZrO_2$ are used as the starting materials. Pb is represented by y, a mixture of $MgCO_3$ and $Nb_2O_5$ in molar ratio of 1:1 is represented by a, a mixture of $Yb_2O_3$ and $Nb_2O_5$ in molar ratio of 1:1 is represented by b, Ti is represented by c, and Zr is represented by d. This piezoelectric ceramic composition can be represented by a general formula:

$$Pb_y[(Mg_{1/3}Nb_{2/3})_a(Yb_{1/2}Nb_{1/2})_b Ti_c\ Zr_d]O_3$$

(where a+b+c+d=1). These are weighed to make up a product composition as shown in Table 1. In accordance with the processes already described, a piezoelectric ceramic disk of 14.3 mm in diameter and 0.6 mm in thickness was manufactured.

Sample No. 20A is a piezoelectric ceramic disk manufactured using a conventional piezoelectric ceramic composition, and appears for reference.

Table 1 also summarizes the results of measurements for density (ρ), dielectric constant (ε), mechanical quality factor (Qm), electromechanical coupling factor (kp), and kp change ratio of the piezoelectric ceramic disk thus manufactured.

The piezoelectric property (i.e. dielectric constant (ε)), mechanical quality factor (Qm) and electromechanical coupling factor (kp) were calculated from the results of measurements of resonance and anti-resonance frequencies using an impedance analyzer.

The kp change ratio is used to evaluate the heat-resistance property. It is obtained by immersing the disk element in a solder bath at 250° C. for one minute and measuring the change of kp. The kp change ratio is given by the following formula:

$$kp\ change\ ratio\ (\%) = [(kp-kp_i)/kp_i] * 100$$

where $kp_i$ is the electromechanical coupling factor before immersion in the solder bath, and kp is the electromechanical coupling factor after immersion in the solder bath for one hour.

The results of the measurements were evaluated for the electromechanical coupling factor (kp) and the change ratio of electromechanical coupling factor. The materials were regarded as acceptable when the electromechanical coupling factor was 60% or more and the change ratio of the electromechanical coupling factor was within ±3%. The other values were regarded as defective.

As a result, samples 1A, 5A, 6A, 9A, 13A, 14A, 16A and 19A were judged as defective based on the electromechanical coupling factor. Samples 1A, 5A, 6A, 9A, 10A, 13A, 14A, 16A and 19A were judged as defective based on the change ratio of the electromechanical coupling factor.

In the overall evaluation, samples 2A, 3A, 4A, 7A, 8A, 11A, 12A, 15A, 17A, and 18A were judged as acceptable (In the table, the samples judged as defective are marked with an asterisk).

TABLE 1

| No. | Composition (molar ratio) | | | | Dens'y (ρ) g/cm³ | Dielect. Const. (ε) | Mechl qual'y factor (Qm) | E-mechl coupl'g factor (kp) % | KP change ratio % |
|---|---|---|---|---|---|---|---|---|---|
| | y | a | b | c | d | | | | |
| *1A | 0.94 | 0.05 | 0.05 | 0.45 | 0.45 | 7.0 | 910 | 113 | 34.4 | −20.2 |
| 2A | 0.95 | 0.05 | 0.05 | 0.45 | 0.45 | 7.6 | 1508 | 96 | 60.1 | −2.6 |
| 3A | 1 | 0.05 | 0.05 | 0.45 | 0.45 | 7.7 | 1017 | 83 | 67.4 | −2.0 |
| 4A | 1.05 | 0.05 | 0.05 | 0.45 | 0.45 | 7.7 | 866 | 83 | 61.2 | −2.4 |
| *5A | 1.06 | 0.05 | 0.05 | 0.45 | 0.45 | 7.6 | 753 | 88 | 34.8 | −22.8 |
| *6A | 1 | 0.005 | 0.055 | 0.47 | 0.47 | 7.8 | 840 | 101 | 45.3 | −18.2 |
| 7A | I | 0.01 | 0.05 | 0.47 | 0.47 | 7.7 | 1084 | 85 | 60.7 | −2.9 |
| 8A | 1 | 0.15 | 0.05 | 0.40 | 0.40 | 7.8 | 725 | 100 | 61.0 | −3.0 |
| *9A | 1 | 0.16 | 0.04 | 0.40 | 0.40 | 7.8 | 782 | 112 | 52.5 | −16.1 |
| *10A | 1 | 0.095 | 0.005 | 0.45 | 0.45 | 7.8 | 2045 | 79 | 75.0 | −16.0 |
| 11A | 1 | 0.09 | 0.01 | 0.45 | 0.45 | 7.9 | 2009 | 78 | 76.3 | −2.9 |
| 12A | 1 | 0.05 | 0.10 | 0.43 | 0.42 | 7.7 | 866 | 95 | 60.5 | −3.0 |
| *13A | 1 | 0.04 | 0.11 | 0.43 | 0.42 | 7.6 | 839 | 91 | 50.0 | −18.2 |
| *14A | 1 | 0.10 | 0.05 | 0.29 | 0.55 | 7.6 | 317 | 392 | 37.4 | −21.3 |
| 15A | 1 | 0.10 | 0.05 | 0.30 | 0.55 | 7.9 | 439 | 165 | 60.2 | −2.7 |
| *16A | 1 | 0.15 | 0.05 | 0.56 | 0.24 | 7.7 | 730 | 95 | 37.7 | −8.5 |
| 17A | 1 | 0.15 | 0.05 | 0.55 | 0.25 | 7.7 | 725 | 100 | 61.0 | −2.8 |
| 18A | 1 | 0.05 | 0.05 | 0.60 | 0.30 | 7.7 | 524 | 197 | 60.3 | −3.0 |
| *19A | 1 | 0.05 | 0.05 | 0.61 | 0.29 | 7.6 | 406 | 252 | 20.2 | −7.0 |
| 20A | 1 | 0.10 | 0 | 0.45 | 0.45 | 7.7 | 1881 | 44 | 58.1 | −20.8 |

In summarizing the composition range of the samples according to the results of evaluation, a sample is defective if it is within the composition range of:

y<0.95 or y>1.05 for y;
a<0.01 or a>0.15 for a;
b<0.01 or b>0.10 for b;
c<0.30 or c>0.60 for c; and
d<0.25 or d>0.55 for d. Therefore, a sample is acceptable if it is within the composition range of:

$0.95 \leq y \leq 1.05$ for y:
$0.01 \leq a \leq 0.15$ for a;
$0.01 \leq b \leq 0.10$ for b;
$0.30 \leq c \leq 0.60$ for c; and
$0.25 \leq d \leq 0.55$ for d.

As is evident from Table 1, in the conventional type piezoelectric ceramic composition, the change ratio of the electromechanical coupling factor due to soldering heat at 250° C. is around −20%, while in the piezoelectric ceramic composition of the present invention, it can be greatly improved to −3.0% to −2.0% or less by simultaneously solubilizing $(Mg_{1/3}Nb_{2/3})O_3$ and $(Yb_{1/2}Nb_{1/2})O_3$ as the third and the fourth components respectively to $PbTiO_3$—$PbZrO_3$.

Figure 2:
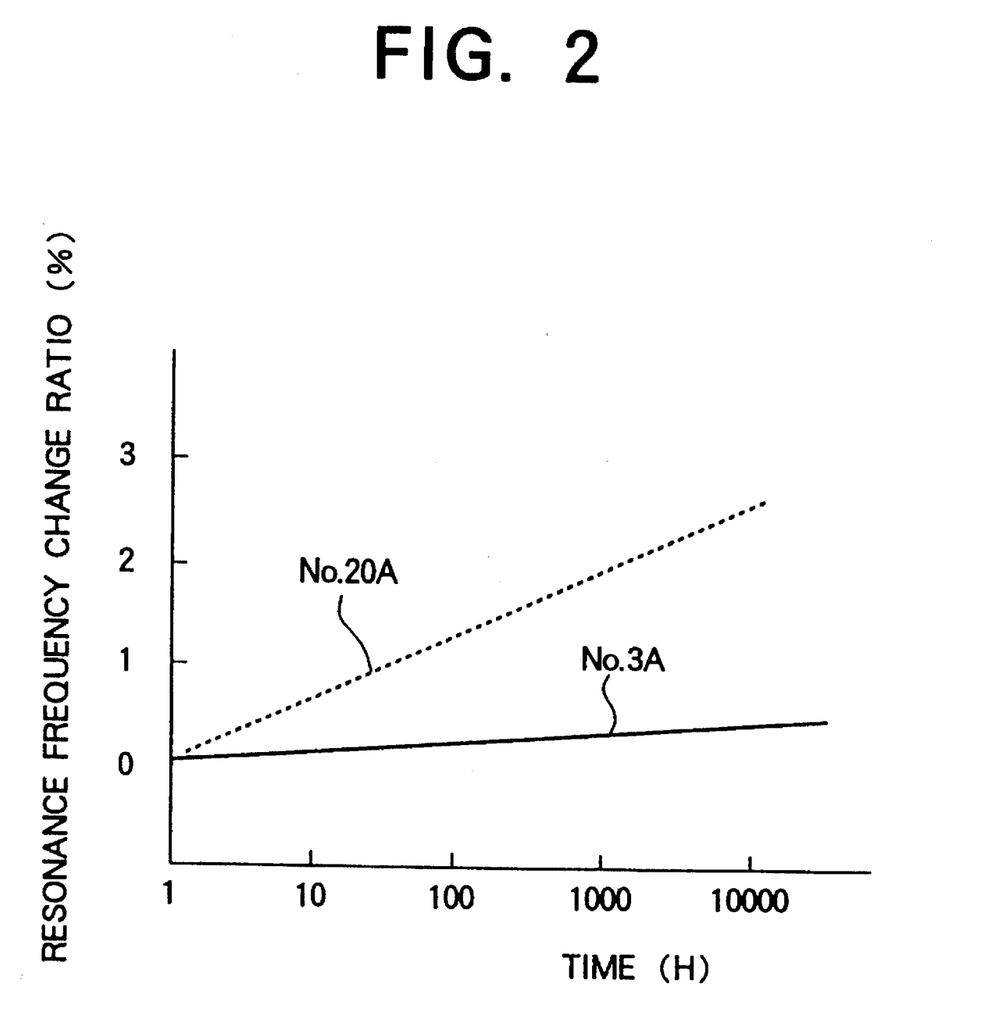
FIG. 2 is a graph illustrating the resonance frequency change ratio over time for the piezoelectric ceramic composition of the present invention and a conventional type piezoelectric ceramic composition.

FIG. 2 shows the change of resonance frequency over time of sample 3A, which is an embodiment of the present invention, and a conventional example, i.e. sample No. 20A.

The change ratio of the resonance frequency is given by the following formula:

Change ratio of resonance frequency (%)=$[(fr-fr_i)/fr_i]*100$ where $fr_i$ represents the resonance frequency in the initial stage (one hour after polarization), and fr represents the resonance frequency at a certain period of time after polarization.

As it is evident from FIG. 2, compared with the conventional type piezoelectric ceramic composition, the change ratio of the resonance frequency of the piezoelectric ceramic composition of the present invention can be reduced to 0.1%/time decade or lower.

Next, a description is given for a piezoelectric ceramic composition obtained by substituting a part of Pb in the starting materials with Me, i.e. Ba, Sr or Ca. The composition ratio of Pb and Me is represented by (1−x) and x respectively. This piezoelectric ceramic composition can be represented by a general formula:

$(Pb_{1-x}Me_x)[(Mg_{1/3}Nb_{2/3})_a(Yb_{1/2}Nb_{1/2})]_b Ti_c Zr_d]O_3$ (where Me represents at least one element selected from Ba, Sr, and Ca, a +b+c+d=1).

Using the piezoelectric ceramic composition obtained by substituting a part of Pb with Me as shown in Table 2, a piezoelectric ceramic disk of the same shape, i.e. 14.3 mm in diameter and 0.6 mm in thickness, was produced by the manufacturing processes described above. For this piezoelectric ceramic disk, density (ρ), dielectric constant (ε), mechanical quality factor (Qm) and electromechanical coupling factor (kp) were determined by the same measuring procedure. Further, the temperature coefficient of resonance frequency (frTC) was measured.

The temperature coefficient of resonance frequency (frTC) is given by the following formula:

$$frTC(ppm/° C.)=[(fr_1-fr_2)/(fr_3*125)]10^6$$

where $fr_1$ and $fr_2$ represent the maximum and minimum values of the resonance frequency in the temperature range from −40° C. to 85° C. respectively, and $fr_3$ represents resonance frequency at 25° C.

Sample No. 25B in Table 2 is a piezoelectric ceramic disk obtained by the use of a conventional piezoelectric ceramic composition, and appears for reference.

Table 2 summarizes the product composition of the piezoelectric ceramic compositions thus obtained and the results of measurements on the piezoelectric ceramic disk.

The results of the measurements were evaluated for the temperature coefficient of resonance frequency (frTC). Similarly to the case of the piezoelectric ceramic disk of Table 1, the materials were regarded as acceptable when kp was 60% or more and the kp change ratio was within ±3%. It was further required that the temperature coefficient of resonance frequency be 200 ppm or less. The materials with other values were regarded as defective.

As a result, samples 5B, 11B, 18B, 19B, 21B and 24B were judged as defective based on the electromechanical coupling factor. Samples 5B, 11B, 14B, 15B, 18B, 19B, 21B and 24B were judged as defective based on the change ratio of the electromechanical coupling factor, and sample 1B was judged as defective based on the temperature coefficient of resonance frequency.

TABLE 2

| No. | Subs'te Comp'n element (molar ratio) Me | x | Basic Composition (molar ratio) a | b | c | d | Dens'y (ρ) g/cm³ | Di- elect. Const. (ε) | Mechl qual'y factor (Qm) | E-mechl coupl'g factor (kp) % | kp change ratio % | Temp're co- effic't (frTC) ppm/°C. |
|---|---|---|---|---|---|---|---|---|---|---|---|---|
| *1B | — | 0 | 0.05 | 0.05 | 0.45 | 0.45 | 7.7 | 1017 | 83 | 67.4 | −2.0 | 356 |
| 2B | Ba | 0.01 | 0.05 | 0.05 | 0.45 | 0.45 | 7.7 | 1161 | 82 | 64.1 | −2.1 | 150 |
| 3B | Ba | 0.05 | 0.05 | 0.05 | 0.45 | 0.45 | 7.7 | 1180 | 80 | 63.8 | −2.0 | 149 |
| 4B | Ba | 0.12 | 0.05 | 0.05 | 0.45 | 0.45 | 7.6 | 1204 | 61 | 63.3 | −2.4 | 141 |
| *5B | Ba | 0.13 | 0.05 | 0.05 | 0.45 | 0.45 | 7.2 | 1364 | 70 | 50.4 | −21.8 | 132 |
| 6B | Sr | 0.05 | 0.05 | 0.05 | 0.45 | 0.45 | 7.6 | 1233 | 92 | 63.1 | −2.2 | 125 |
| 7B | Ca | 0.05 | 0.05 | 0.05 | 0.45 | 0.45 | 7.6 | 1256 | 90 | 60.1 | −2.1 | 126 |
| 8B | Ba | 0.08 | 0.05 | 0.05 | 0.45 | 0.45 | 7.7 | 1204 | 87 | 63.7 | −2.2 | 143 |
| 9B | Sr | 0.08 | 0.05 | 0.05 | 0.45 | 0.45 | 7.6 | 1301 | 101 | 62.5 | −2.3 | 121 |
| 10B | Ca | 0.08 | 0.05 | 0.05 | 0.45 | 0.45 | 7.6 | 1398 | 91 | 60.3 | −2.1 | 120 |
| *11B | Ba | 0.05 | 0.005 | 0.055 | 0.47 | 0.47 | 7.7 | 821 | 98 | 44.8 | −20.4 | 155 |
| 12B | Ba | 0.05 | 0.01 | 0.05 | 0.47 | 0.47 | 7.7 | 1197 | 88 | 60.2 | −2.8 | 150 |
| 13B | Ba | 0.05 | 0.15 | 0.05 | 0.40 | 0.40 | 7.7 | 833 | 95 | 61.0 | −2.9 | 148 |
| *14B | Ba | 0.05 | 0.16 | 0.04 | 0.40 | 0.40 | 7.7 | 801 | 104 | 50.1 | −19.6 | 153 |
| *15B | Ba | 0.05 | 0.095 | 0.005 | 0.45 | 0.45 | 7.7 | 2095 | 81 | 66.6 | −17.3 | 154 |
| 16B | Ba | 0.05 | 0.09 | 0.01 | 0.45 | 0.45 | 7.7 | 2012 | 84 | 67.8 | −3.0 | 150 |
| 17B | Ba | 0.05 | 0.05 | 0.10 | 0.43 | 0.42 | 7.6 | 866 | 95 | 60.5 | −2.9 | 151 |
| *18B | Ba | 0.05 | 0.04 | 0.11 | 0.43 | 0.42 | 7.5 | 855 | 106 | 48.7 | −22.9 | 147 |
| *19B | Ba | 0.05 | 0.10 | 0.05 | 0.29 | 0.56 | 7.5 | 423 | 341 | 32.6 | −22.4 | 135 |
| 20B | Ba | 0.05 | 0.10 | 0.05 | 0.30 | 0.55 | 7.6 | 595 | 121 | 60.2 | −2.8 | 137 |
| *21B | Ba | 0.05 | 0.15 | 0.05 | 0.56 | 0.24 | 7.6 | 780 | 99 | 35.4 | −9.6 | 145 |
| 22B | Ba | 0.05 | 0.15 | 0.05 | 0.55 | 0.25 | 7.6 | 820 | 103 | 61.1 | −2.9 | 144 |
| 23B | Ba | 0.05 | 0.05 | 0.05 | 0.60 | 0.30 | 7.6 | 650 | 154 | 60.5 | −2.7 | 149 |
| *24B | Ba | 0.05 | 0.05 | 0.05 | 0.61 | 0.29 | 7.5 | 488 | 264 | 30.3 | −8.4 | 156 |
| 25B | — | 0 | 0.10 | 0 | 0.45 | 0.45 | 7.7 | 1881 | 44 | 56.1 | −20.8 | 368 |

In the overall evaluation, samples 2B, 3B, 4B, 6B, 7B, 8B, 9B, 10B, 12B, 13B, 16B, 17B, 20B, 22B and 23B were judged as acceptable.

In summarizing the composition range of the samples according to the results of the evaluation, a sample is defective if it is within the composition range of:

x>0.12 for x;

a<0.01 or a>0.15 for a;

b<0.01 or b>0.10 for b;

c<0.30 or c>0.60 for c; and d<0.25 or d>0.55 for d.

Therefore, a sample is acceptable if it is within the composition range of:

$0 < x \leq 0.12$ for x;

$0.01 \leq a \leq 0.15$ for a;

$0.01 \leq b \leq 0.10$ for b;

$0.30 \leq c \leq 0.60$ for c; and $0.25 \leq d \leq 0.55$ for d.

As is evident from Table 2, by substituting a part of Pb with at least one element selected from Ba, Sr and Ca, it is possible to greatly improve the temperature coefficient of resonance frequency (frTC) without decreasing the heat-resistance property and the resistance to change over time.

When the change of resonance frequency over time was determined for sample No. 3B, the value was as low as 0.1%/time decade or less as in the case of the sample No. 3A in Table 1.

A description will now be given on a piezoelectric ceramic disk using a piezoelectric ceramic composition, which has Yb as bivalent.

This piezoelectric ceramic disk is produced by the same procedure as described above, except that the materials are sintered at 1100° C. to 1260° C.

As the starting materials, PbO, $MgCO_3$, $Yb_2O_3$, $Nb_2O_5$, $TiO_2$ and $ZrO_2$ were used. $Mg_{1/3}.Nb_{2/3}$ was represented by e, $Yb_{1/3}.Nb_{2/3}$ was represent by f, Pb.Ti was represented by g, and Pb.Zr was represented by h. This piezoelectric ceramic composition can be represented by a general formula:

$$Pb[(Mg_{1/3}Nb_{2/3})_e(Yb_{1/3}Nb_{2/3})_f Ti_g Zr_h]O_3$$

(where e+f+g+H=1). These materials were weighed to make up a product composition shown in Table 3. In accordance with the processes described above, a piezoelectric ceramic disk of 15 mm in diameter and 1 mm in thickness was manufactured. On each of the piezoelectric ceramic disks thus obtained, density, electromechanical coupling factor, dielectric constant and mechanical quality factor were determined.

Table 3 summarizes the composition of the piezoelectric ceramic compositions thus obtained and the results of measurement on the piezoelectric ceramic disks.

The results of the measurement were evaluated by the same procedure as the piezoelectric ceramic disks shown in Table 1. The materials were regarded as acceptable when kp was 60% or more and the kp change ratio was within ±3%. The materials with other values were regarded as defective.

TABLE 3

| No. | Composition (molar ratio) | | | | Dens'y (ρ) g/cm³ | Dielect. const. (ε) | Mechl qual'y factor (Qm) | E-mechl coupl'g factor (kp) % | KP change ratio % |
|---|---|---|---|---|---|---|---|---|---|
| | e | f | g | h | | | | | |
| 1C | 0.06 | 0.06 | 0.44 | 0.44 | 7.8 | 1150 | 85 | 62.5 | −2.0 |
| *2C | 0.005 | 0.065 | 0.47 | 0.46 | 7.5 | 950 | 90 | 46.0 | −19.5 |
| 3C | 0.01 | 0.06 | 0.47 | 0.46 | 7.7 | 1100 | 85 | 60.5 | −3.0 |
| 4C | 0.15 | 0.05 | 0.42 | 0.38 | 7.7 | 1020 | 90 | 61.0 | −3.0 |
| *5C | 0.16 | 0.04 | 0.42 | 0.38 | 7.5 | 850 | 100 | 45.5 | −18.5 |
| *6C | 0.095 | 0.005 | 0.44 | 0.46 | 7.5 | 1250 | 85 | 60.0 | −18.0 |
| 7C | 0.09 | 0.01 | 0.44 | 0.46 | 7.8 | 1300 | 100 | 65.0 | −2.5 |
| 8C | 0.05 | 0.15 | 0.42 | 0.38 | 7.7 | 1010 | 90 | 60.5 | −3.0 |
| *9C | 0.04 | 0.16 | 0.42 | 0.38 | 7.3 | 890 | 95 | 48.0 | −19.0 |
| *10C | 0.11 | 0.06 | 0.25 | 0.58 | 7.4 | 750 | 300 | 40.0 | −22.0 |
| 11C | 0.11 | 0.06 | 0.30 | 0.53 | 7.7 | 1000 | 100 | 60.0 | −3.0 |
| *12C | 0.15 | 0.06 | 0.56 | 0.23 | 7.4 | 780 | 90 | 38.0 | −12.0 |
| 13C | 0.15 | 0.06 | 0.54 | 0.25 | 7.7 | 1010 | 95 | 60.5 | −2.7 |
| 14C | 0.07 | 0.03 | 0.60 | 0.30 | 7.7 | 1000 | 110 | 60.2 | −3.0 |
| *15C | 0.07 | 0.03 | 0. | | 7.4 | 730 | 200 | 30.5 | −9.5 |

In general, in producing a piezoelectric ceramic composition, it is widely known that it is possible to blend the materials to match the stable valence of the element used in case a plurality of stable valence states are present, i.e. in case it is possible to constitute oxides in a plurality of oxidation states.

For example, in a three-component type piezoelectric material using Mn and Nb as the third components, $PbTiO_3$—$PbZrO_3$—$Pb(Mn_{1/3}Nb_{2/3})O_3$ having Mn as bivalent and $PbTiO_3$—$PbZrO_3$$Pb(Mn_{1/2}Nb_{1/2})O_3$ having Mn as trivalent are both used in practical application.

The present inventors have found that Yb used in the above embodiment is an element that may be bivalent or trivalent for stable valence, while, even when it is treated as bivalent, the effect of the present invention can be attained.

As a result, samples 2C, 5C, 9C, 10C, 12C and 15C were judged as defective based on the electromechanical coupling factor. Samples 2C, 5C, 6C, 9C, 10C, 12C and 15C were judged as defective based on the change ratio of the electromechanical coupling factor.

In the overall evaluation, samples 1C, 3C, 4C, 7C, 8C, 11C, 13C and 14C were judged as acceptable.

In summarizing the composition range of the samples according to the results of evaluation, a sample is defective if it is within the composition range of:

e<0.01 or e>0.15 for e;

f<0.01 or f>0.15 for f;

g<0.30 or g>0.60 for g; and h<0.25 or h≧0.58 for h.

Therefore, a sample is acceptable if it is within the composition range of:

$0.01 \leq e \leq 0.15$ for e;

$0.01 \leq f \leq 0.15$ for f;

$0.30 \leq g \leq 0.60$ for g; and $0.25 \leq h < 0.58$ for h.

Specifically,

1. In the case where e<0.01, the sintering property of the element is aggravated, and the high electromechanical coupling factor desired is not obtained. Also, the heat-resistance property decreases. The heat-resistance property also decreases when e>0.15.

2. In the case where f<0.01, the heat-resistance property decreases. Where f>0.15, the sintering property decreases, the high electromechanical coupling factor desired is not obtained, and the heat-resistance property is aggravated.

3. Where g<0.30 or g>0.60, the desired high electromechanical coupling factor is not obtained and the heat-resistance property decreases.

4. In a composition with h<0.25, the desired high electromechanical coupling factor is not obtained. Further, where d>0.58, the desired improvement of the heat-resistance property is not obtained.

As is evident from Table 3, in the conventional piezoelectric ceramic composition, the change ratio of the electromechanical coupling factor due to soldering heat at 250° C. is around −20%, while in the piezoelectric ceramic composition of the present invention, it can be greatly improved to −3% or less by simultaneously solubilizing $(Mg_{1/3}Nb_{2/3})O_3$ and $(Yb_{1/3}Nb_{2/3})O_3$ as the third and the fourth components respectively to $PbTiO_3$—$PbZrO_3$.

When the change of resonance frequency over time was determined for sample No. 1E, the value was as low as 0.1%/time decade or less as in the case of sample No. 3A in FIG. 2.

Next, a description is given on a piezoelectric ceramic disk using the piezoelectric ceramic composition containing $Cr_2O_3$ and $MnO_2$ added as secondary components to the piezoelectric composition having Yb as bivalent, referring to Table 4.

The piezoelectric ceramic composition used for this piezoelectric ceramic disk is produced through the manufacturing processes shown in FIG. 1 except that $Cr_3O_3$ and $MnCO_3$ are added as the starting materials to the piezoelectric ceramic composition shown in Table 3 to make up the product composition shown in Table 3.

Table 4 also summarizes the results of the measurements of density (ρ), dielectric constant (ε), mechanical quality factor (Qm), electromechanical coupling factor (kp) and change ratio of electromechanical coupling factor (kp) of each of the piezoelectric ceramic disks.

The results of the measurements were evaluated for kp and kp change ratio by the same procedure as the piezoelectric ceramic disks of Table 1. The materials were regarded as acceptable when kp was 60% or more and the kp change ratio was within ±3%. The materials with other values were regarded as defective.

TABLE 4

| No. | Composition (molar ratio) | | | | Second'y element (Wt %) | | Dens'y (ρ) g/cm³ | Dielect. Const. (ε) | Mechl qual'y factor (Qm) | E-mechl coupl'g factor (kp) % | KP change ratio % |
|---|---|---|---|---|---|---|---|---|---|---|---|
| | e | f | 9 | h | Cr₂O₃ | MnO₂ | | | | | |
| *1D | 0.06 | 0.06 | 0.44 | 0.44 | — | 0.005 | 7.8 | 1150 | 85 | 62.3 | — |
| 2D | 0.06 | 0.06 | 0.44 | 0.44 | — | 0.02 | 7.7 | 1160 | 1000 | 62.0 | −1.9 |
| 3D | 0.06 | 0.06 | 0.44 | 0.44 | — | 0.9 | 7.7 | 1200 | 1550 | 64.5 | −1.5 |
| 4D | 0.06 | 0.06 | 0.44 | 0.44 | — | 1.8 | 7.7 | 1250 | 1100 | 62.2 | −3.0 |
| *5D | 0.06 | 0.06 | 0.44 | 0.44 | — | 2.3 | 7.4 | 810 | 400 | 49.6 | −20.0 |
| 6D | 0.06 | 0.06 | 0.44 | 0.44 | 0.2 | — | 7.8 | 1160 | 510 | 63.5 | −2.0 |
| 7D | 0.06 | 0.06 | 0.44 | 0.44 | 0.4 | — | 7.8 | 1190 | 760 | 63.0 | −2.0 |
| 8D | 0.06 | 0.06 | 0.44 | 0.44 | 0.3 | 0.5 | 7.8 | 1210 | 1400 | 64.1 | −1.8 |
| *9D | 0.005 | 0.065 | 0.47 | 0.46 | — | 0.9 | 7.5 | 940 | 490 | 47.3 | −18.5 |
| 10D | 0.01 | 0.06 | 0.47 | 0.46 | — | 0.9 | 7.7 | 1110 | 1050 | 60.4 | −2.8 |
| 11D | 0.15 | 0.05 | 0.42 | 0.38 | — | 0.9 | 7.8 | 1050 | 1250 | 62.1 | −2.5 |
| *12D | 0.16 | 0.04 | 0.42 | 0.38 | — | 0.9 | 7.5 | 870 | 900 | 50.0 | −17.9 |
| *13D | 0.095 | 0.005 | 0.44 | 0.46 | — | 0.9 | 7.5 | 1250 | 1100 | 60.2 | −17.1 |
| 14D | 0.09 | 0.01 | 0.44 | 0.46 | — | 0.9 | 7.8 | 1340 | 1320 | 66.4 | −2.4 |
| 15D | 0.05 | 0.15 | 0.42 | 0.38 | — | 0.9 | 7.7 | 1020 | 1370 | 61.5 | −2.8 |
| *16D | 0.05 | 0.05 | 0.45 | 0.45 | 0.3 | — | 7.4 | 910 | 1150 | 48.2 | −20.5 |
| *17D | 0.11 | 0.06 | 0.25 | 0.58 | — | 0.9 | 7.4 | 800 | 1050 | 46.1 | −21.0 |
| 18D | 0.11 | 0.06 | 0.30 | 0.53 | — | 0.9 | 7.6 | 1030 | 1300 | 60.3 | −2.5 |
| *19D | 0.15 | 0.06 | 0.56 | 0.23 | — | 0.9 | 7.4 | 770 | 950 | 41.2 | −12.5 |
| 20D | 0.15 | 0.06 | 0.54 | 0.25 | — | 0.9 | 7.7 | 1040 | 1100 | 61.0 | −2.7 |
| 21D | 0.07 | 0.03 | 0.60 | 0.30 | — | 0.9 | 7.6 | 1010 | 1100 | 60.4 | −2.7 |
| *22D | 0.07 | 0.03 | 0.61 | 0.29 | — | 0.9 | 7.4 | 750 | 850 | 33.3 | −11.2 |

As a result, samples 5D, 9D, 12D, 16D, 17D, 19D and 22D were judged as defective based on the electromechanical coupling factor. Samples 1D, 5D, 9D, 12D, 13D, 16D, 17D, 19D and 22D were judged as defective based on the change ratio of the electromechanical coupling factor.

In the overall evaluation, samples 2D, 3D, 4D, 6D, 7D, 8D, 10D, 11D, 14D, 15D, 18D, 20D and 21D were judged as acceptable.

In summarizing the composition range of the samples according to the results of evaluation, a sample is defective if it is within the composition range of:

e<0.01 or e>0.15 for e;

f<0.01 or f>0.15 for f;

g<0.30 or g>0.60 for g; and h<0.25 or h≧0.58 for h. Therefore, a sample is acceptable if it is within the composition range of:

$0.01 \leq f \leq 0.15$ for f;

$0.30 \leq g \leq 0.60$ for g; and $0.25 \leq h < 0.58$ for h.

Specifically,

1. Where e<0.01, the sintering property of the element is aggravated, and the desired high electromechanical coupling factor is not obtained. Also, the heat-resistance property decreases. The heat-resistance property also decreases when e>0.15.

2. Where f<0.01, the heat-resistance property decreases. Where f>0.15, the sintering property decreases, the high electromechanical coupling factor desired is not obtained and the heat-resistance property is aggravated.

3. Where g<0.30 or g>0.60, the desired high electromechanical coupling factor is not obtained and heat-resistance property decreases.

4. In a composition with h<0.25, the desired high electromechanical coupling factor is not obtained. Further, where h>0.58, the desired improvement to the heat-resistance property is not obtained.

5. In the case where at least one element selected from Cr and Mn is added as a secondary component by 0.02 to 1.8 weight % as converted respectively, it is possible to improve the mechanical quality factor (Qm) without decreasing the piezoelectric property, while improving the heat-resistance property and the change over time.

If $Cr_2O_3$ and $MnO_2$ as secondary components are added by less than 0.02 weight %, Qm cannot be improved. If these are added by more than 1.8 weight %, the heat-resistance property decreases.

Further, by selecting the composition ratio, it is possible to obtain a piezoelectric ceramic material having a mechanical quality factor of 500 or more without decreasing the piezoelectric property from the materials having an electromechanical coupling factor of 60% or more.

Next, a description is given on a piezoelectric ceramic composition obtained by substituting a part of Pb in the piezoelectric ceramic composition having Yb as bivalent with Ba, Sr or Ca. The compositions of Pb and Me are represented by (1−x) and x respectively.

Using a piezoelectric ceramic composition of Table 2 obtained by substituting a part of Pb with Me, a piezoelectric ceramic disk of 15 mm in diameter and 1 mm in thickness was manufactured by the manufacturing processes as described above. On each of the piezoelectric ceramic disks, density (ρ), dielectric constant (ε), and electromechanical coupling factor (kp) were determined by the same procedure. Further, the temperature coefficient of resonance frequency (frTC) and mechanical quality factor (Qm) were measured.

Table 5 summarizes the composition of the piezoelectric ceramic composition thus obtained and the results of measurement on the piezoelectric ceramic disks. The composition of Me is represented by x. This piezoelectric ceramic composition can be represented by a general formula:

$$(Pb_{1-x}Me_x)[(Mg_{1/3}Nb_{2/3})_e(Yb_{1/3}Nb_{2/3})_f Ti_g Zr_h]O_3$$

(where Me represents at least one element selected from Ba, Sr, and Ca, and e+f+g+h=1).

TABLE 5

| No. | Subs'te Comp'n element (molar ratio) Me | x | Basic Composition (molar ratio) e | f | g | h | Dens'y (ρ) g/cm³ | Di-elect. Const. (ε) | Mechl qual'y factor (Qm) | E-mechl coupl'g factor (kp) % | kp change ratio % | Temp're co-effic't (frTC) ppm/°C. |
|---|---|---|---|---|---|---|---|---|---|---|---|---|
| *1E | — | 0 | 0.06 | 0.06 | 0.44 | 0.44 | 7.8 | 1150 | 85 | 62.5 | −2.0 | 340 |
| 2E | Sr | 0.01 | 0.06 | 0.06 | 0.44 | 0.44 | 7.7 | 1150 | 85 | 63.0 | 2.1 | 130 |
| 3E | Sr | 0.05 | 0.06 | 0.06 | 0.44 | 0.44 | 7.7 | 1200 | 80 | 64.1 | 2.0 | 120 |
| 4E | Sr | 0.12 | 0.06 | 0.06 | 0.44 | 0.44 | 7.6 | 1250 | 80 | 63.0 | 2.5 | 120 |
| *5E | Sr | 0.15 | 0.06 | 0.06 | 0.44 | 0.44 | 7.0 | 1380 | 75 | 49.5 | −22.0 | 140 |
| 6E | Ba | 0.05 | 0.06 | 0.06 | 0.44 | 0.44 | 7.7 | 1240 | 95 | 62.0 | −2.3 | 140 |
| 7E | Ca | 0.05 | 0.06 | 0.06 | 0.44 | 0.44 | 7.6 | 1270 | 90 | 61.3 | −2.2 | 110 |
| 8E | Ba | 0.08 | 0.05 | 0.06 | 0.44 | 0.44 | 7.7 | 1170 | 90 | 63.1 | −2.4 | 130 |
| 9E | Sr | 0.08 | 0.06 | 0.06 | 0.44 | 0.44 | 7.6 | 1320 | 95 | 60.5 | −2.2 | 110 |
| 10E | Ca | 0.08 | 0.06 | 0.06 | 0.44 | 0.44 | 7.6 | 1400 | 90 | 60.2 | −2.3 | 105 |
| *11E | Sr | 0.05 | 0.005 | 0.065 | 0.47 | 0.46 | 7.5 | 960 | 95 | 46.2 | −21.5 | 150 |
| 12E | Sr | 0.05 | 0.01 | 0.06 | 0.47 | 0.46 | 7.7 | 1160 | 85 | 60.5 | −2.9 | 140 |
| 13E | Sr | 0.05 | 0.15 | 0.05 | 0.42 | 0.38 | 7.7 | 1020 | 95 | 61.0 | −3.0 | 140 |
| *14E | Sr | 0.05 | 0.16 | 0.04 | 0.42 | 0.48 | 7.5 | 900 | 100 | 47.0 | −19.5 | 130 |
| *15E | Sr | 0.05 | 0.095 | 0.005 | 0.44 | 0.46 | 7.6 | 1340 | 90 | 60.7 | −19.0 | 140 |
| 16E | Sr | 0.05 | 0.09 | 0.01 | 0.44 | 0.46 | 7.7 | 1400 | 100 | 66.7 | −3.0 | 130 |
| 17E | Sr | 0.05 | 0.05 | 0.15 | 0.42 | 0.38 | 7.7 | 1030 | 95 | 60.2 | −2.9 | 130 |
| *18E | Sr | 0.05 | 0.04 | 0.16 | 0.42 | 0.38 | 7.2 | 920 | 95 | 49.0 | −21.9 | 140 |
| *19E | Sr | 0.05 | 0.11 | 0.06 | 0.25 | 0.58 | 7.4 | 770 | 305 | 40.8 | −22.5 | 130 |
| 20E | Sr | 0.05 | 0.11 | 0.06 | 0.30 | 0.53 | 7.6 | 1010 | 100 | 60.1 | −3.0 | 120 |
| *21E | Sr | 0.05 | 0.15 | 0.06 | 0.56 | 0.23 | 7.3 | 810 | 95 | 40.2 | −13.5 | 140 |
| 22E | Sr | 0.05 | 0.15 | 0.06 | 0.54 | 0.25 | 7.6 | 1010 | 100 | 60.0 | −2.9 | 130 |
| 23E | Sr | 0.05 | 0.07 | 0.03 | 0.60 | 0.30 | 7.6 | 1000 | 115 | 60.5 | −3.0 | 130 |
| *24E | Sr | 0.05 | 0.07 | 0.03 | 0.61 | 0.29 | 7.3 | 740 | 210 | 31.0 | −10.5 | 140 |

The results of the measurement were evaluated by the same procedure as in Table 2. Similarly to the piezoelectric ceramic disks shown in Table 1, the disks were regarded as acceptable when kp was 60% or more, the kp change ratio was within ±3%, and further when the temperature coefficient of resonance frequency (frTC) was 200 ppm or less. The materials with other values were regarded as defective.

As a result, samples 11E, 14E, 18E, 19E, 21E and 24E were judged as defective based on the electromechanical coupling factor. Samples 5E, 11E, 14E, 15E, 18E, 19E, 21E and 24E were judged as defective based on the change ratio of the electromechanical coupling factor. Sample 1E was judged as defective based on the temperature coefficient of resonance frequency.

In the overall evaluation, samples 2E, 3E, 4E, 6E, 7E, 8E, 9E, 10E, 12E, 13E, 16E, 17E, 20E, 22E and 23E were judged as acceptable.

In summarizing the composition range of the samples according to the results of evaluation, a sample is defective if it is within the composition range of:

x<0.01 or x>0.12 for x;

e<0.01 or e>0.15 for e;

f<0.01 or f>0.15 for f;

g<0.30 or g>0.60 for g; and h<0.25 or h≧0.58 for h.

Therefore, a sample is acceptable if it is within the composition range of:

021 x≦0.12 for x;

0.01≦e≦0.15 for e;

0.01≦f≦0.15 for f;

0.30≦g≦0.60 for g; and 0.25≦h<0.58 for h.

Specifically,

1. Where e<0.01, the sintering property of the element is aggravated, the high electromechanical coupling factor desired is not obtained and the heat-resistance property decreases. The heat-resistance property also decreases when e>0.15.

2. Where f<0.01, the heat-resistance property decreases. Where f>0.15, the sintering property decreases, the high electromechanical coupling factor desired is not obtained, and the heat-resistance property is aggravated.

3. In the case where g<0.30 or g>0.60, the desired high electromechanical coupling factor is not obtained and the heat-resistance property decreases.

4. In a composition with h<0.25, the desired high electromechanical coupling factor is not obtained. Further, where h>0.58, the desired improvement to the heat-resistance property is not obtained.

5. In the case where a part of Pb is substituted with at least one of Ba, Sr or Ca, the temperature coefficient of resonance frequency (fr) increases without decreasing the heat-resistance property and change over time. In the case where Me is 0.0, the temperature coefficient of resonance frequency cannot increase. If Me is more than 0.12, the heat-resistance property decreases. Thus, it is preferred that 0<x≦0.12.

As is evident from Table 5, in the conventional piezoelectric ceramic composition, the change ratio of electromechanical coupling factor due to soldering heat at 250° C. is around −20%, while in the piezoelectric ceramic composition of the present invention, it can be greatly improved to −2.0% to −3.0% by simultaneously solubilizing $(Mg_{1/3}Nb_{2/3})O_3$ and $(Yb_{1/3}Nb_{2/3})O_3$ as the third and the fourth components respectively to $PbTiO_3$—$PbZrO_3$.

Further, by substituting a part of Pb with at least one of Ba, Sr, or Ca, it is possible to greatly improve the temperature coefficient of resonance frequency (frTC) without decreasing the heat-resistance property and the change over time.

When the change of resonance frequency over time was determined for sample No. 3E, the value was as low as 0.1%/time decade or less, similar to the case of sample No. 3A of FIG. 2.

As is self-explanatory from the above description, it is possible by the use of the piezoelectric ceramic composition of the present invention to provide a piezoelectric ceramic element that has a high electromechanical coupling factor (kp) and heat-resistance property, and that exhibits a better temperature coefficient of resonance frequency with an improved heat-resistance property and extremely low change over time. Therefore, it is possible to manufacture chip parts in which the piezoelectric property does not decrease even when exposed to temperatures around 250° C. during surface packaging.

In the examples described above, the starting materials are oxides or carbonates. Similar effects can be obtained when carbonates, organic acid salts or hydroxides are used instead of the oxides, and oxides, organic acid salts or hydroxides are used instead of the carbonates.

What we claim is:

1. A piezoelectric ceramic composition, expressed by a general formula:

$Pb_y[(Mg_{1/3}Nb_{2/3})_a(Yb_{1/2}Nb_{1/2})_bTi_cZr_d]O_3$ (where a+b+c+d=1), and the following conditions are satisfied:

0.95≦y≦1.05

0.01≦a≦0.15

0.01≦b≦0.10

0.30≦c≦0.60

0.25≦d≦0.55.

2. A piezoelectric ceramic composition, expressed by a general formula:

$Pb[(Mg_{1/3}Nb_{2/3})_e(Yb_{1/3}Nb_{2/3})_fTi_gZr_h]O_3$ (where e+f+g+h=1), and the following conditions are satisfied:

0.01≦e≦0.15

0.01≦f≦0.15

0.30≦g≦0.60

0.25≦h<0.58.

3. A piezoelectric ceramic composition, expressed by a general formula:

$(Pb_{1-x}Me_x)[(Mg_{1/3}Nb_{2/3})_e(Yb_{1/3}Nb_{2/3})_fTi_gZr_h]O_3$ (where Me represents at least one element selected from Ba,Sr and Ca, and e+f+g+h=1), and the following conditions are satisfied:

0<x≦0.12

0.01≦e≦0.15

0.01≦f≦0.15

0.30≦g≦0.60

0.25≦h<0.58.

4. A piezoelectric ceramic composition, comprising a composition expressed by a general formula:

$Pb[(Mg_{1/3}Nb_{2/3})_e(Yb_{1/3}Nb_{2/3})_fTi_gZr_h]O_3$ (where e+f+g+h=1), and the following conditions are satisfied:

0.01≦e≦0.15

0.01≦f≦0.15

0.30≦g≦0.60

0.25≦h<0.58 as a base component, and further comprising at least one element selected from Cr and Mn as a secondary component, said at least one element being present in amounts of 0.02 to 1.8 weight % as $Cr_2O_3$ and $MnO_2$ respectively.

* * * * *

UNITED STATES PATENT AND TRADEMARK OFFICE
CERTIFICATE OF CORRECTION

PATENT NO. : 5,527,481
DATED : June 18, 1996
INVENTOR(S) : Satoshi Otsu, Fumikazu Yamane, and Masaharu Kamihara It is certified that error appears in the above-identified patent and that said Letters Patent is hereby corrected as shown below:

In the abstract, on the first page, second column of the printed patent, lines 25-26, delete "Me represents at least one element selected from Ba, Sr and Ca, and".

In the abstract, on the first page, second column of the printed patent, line 26, delete "$0 \leq x \leq 0.12$".

In column 8, line 15 of the printed patent, "(where e+f+g+H=1)" should read --(where e+f+g+h=1)--.

In column 10, after line 64 and before line 65 of the printed patent,
--$0.01 \leq e \leq 0.15$ for e;--
should be inserted.

In column 13, line 17 of the printed patent, "021 $x \leq 0.12$ for x;" should read --$0 < x \leq 0.12$ for x;--.

Signed and Sealed this

Second Day of December, 1997

Attest:

BRUCE LEHMAN

*Attesting Officer*         *Commissioner of Patents and Trademarks*